United States Patent
Ohashi

(10) Patent No.: US 9,882,255 B2
(45) Date of Patent: Jan. 30, 2018

(54) TRANSMISSION LINE AND TRANSMISSION METHOD

(71) Applicant: Sony Corporation, Tokyo (JP)

(72) Inventor: Sho Ohashi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 60 days.

(21) Appl. No.: 14/371,556

(22) PCT Filed: Jan. 9, 2013

(86) PCT No.: PCT/JP2013/050210
§ 371 (c)(1),
(2) Date: Jul. 10, 2014

(87) PCT Pub. No.: WO2013/108687
PCT Pub. Date: Jul. 25, 2013

(65) Prior Publication Data
US 2014/0354369 A1    Dec. 4, 2014

(30) Foreign Application Priority Data
Jan. 18, 2012    (JP) .................................. 2012-007700

(51) Int. Cl.
*H01P 1/213* (2006.01)
*H01P 5/19* (2006.01)
(Continued)

(52) U.S. Cl.
CPC ................ *H01P 1/213* (2013.01); *H01P 3/16* (2013.01); *H01P 5/19* (2013.01); *H03H 7/38* (2013.01);
(Continued)

(58) Field of Classification Search
CPC ...... H03H 7/38; H03H 2007/386; H01P 3/10; H01P 5/103; H01P 5/107; H01P 3/12;
(Continued)

(56) References Cited

U.S. PATENT DOCUMENTS 4,071,833 A  *  1/1978  Gould ..................... H01P 5/103
                                                    333/254
5,942,944 A  *  8/1999  Paolella .................... H01P 5/12
                                                    330/286
(Continued)

FOREIGN PATENT DOCUMENTS

JP     52-032612    3/1977
JP     8-508351    9/1996
(Continued)

*Primary Examiner* — Benny Lee
*Assistant Examiner* — Jorge Salazar, Jr.
(74) *Attorney, Agent, or Firm* — Chip Law Group

(57) ABSTRACT

The present technology relates to a transmission line and transmission method that allow multi-mode transmission to be easily performed using electrical signals as a transmission target. A multi-mode waveguide is connected to a metal wire configured to transmit an electrical signal via a matching structure configured to perform impedance matching between the multi-mode waveguide and the metal wire. For example, the electrical signal can be a signal of a millimeter wave band. For example, the multi-mode waveguide, the metal wire, and the matching structure can be arranged to be aligned on a plane. The present technology can be applied to, for example, transmission for electrical signals such as millimeter waves.

13 Claims, 8 Drawing Sheets

(51) Int. Cl.
  *H01P 3/16* (2006.01)
  *H03H 7/38* (2006.01)
  *H01P 3/12* (2006.01)
  *H01P 3/10* (2006.01)
  *H04B 10/2581* (2013.01)

(52) U.S. Cl.
  CPC .................. *H01P 3/10* (2013.01); *H01P 3/12* (2013.01); *H03H 2007/386* (2013.01); *H04B 10/2581* (2013.01)

(58) Field of Classification Search
  CPC .... H01P 5/09; H01P 5/19; H01P 3/081; H01P 1/2086; H01P 1/213; H01P 5/181; H01P 5/182; H01P 3/16; H04B 10/2581
  USPC ......... 333/26, 33, 1, 5, 24 R, 132, 134, 135, 333/248
  See application file for complete search history.

(56) References Cited

U.S. PATENT DOCUMENTS

| | | | |
|---|---|---|---|
| 6,781,477 B1 * | 8/2004 | Stancil | H01P 3/12 333/125 |
| 2013/0265732 A1 * | 10/2013 | Herbsommer | H05K 1/0274 361/774 |

FOREIGN PATENT DOCUMENTS

| | | |
|---|---|---|
| JP | 2001-160703 | 6/2001 |
| JP | 2010-093444 | 4/2010 |

* cited by examiner

TRANSMISSION LINE AND TRANSMISSION METHOD

TECHNICAL FIELD

The present technology relates to transmission lines and transmission methods, and particularly relates to a transmission line and transmission method that allow multi-mode transmission through a plurality of transmission routes (modes) to be easily performed using electrical signals as a transmission target.

BACKGROUND ART

For multi-mode transmission (propagation) intended for light, a various types of techniques have been proposed.

For example, Patent Literature 1 discloses the multi-mode interference coupler including sections that form a multi-mode waveguide through which a plurality (modes) of light beams are transmitted.

CITATION LIST

Patent Literature

Patent Literature 1: JP H8-508351T

SUMMARY OF INVENTION

Technical Problem

However, for example, if the multi-mode transmission intended for electrical signals such as millimeter waves is carried out by using the multi-mode transmission technique intended for light without any change, then electrical signals have a longer wavelength than light, and thus a problem may occur.

The present technology is made in view of such a circumstance, and it is intended to be capable of easily performing multi-mode transmission intended for electrical signals.

Solution to Problem

A transmission line according to a first aspect of the present technology is a transmission line including a multi-mode waveguide, a metal wire configured to transmit an electrical signal, and a matching structure configured to be connected to the multi-mode waveguide and the metal wire, and configured to perform impedance matching between the multi-mode waveguide and the metal wire.

A transmission method according to the first aspect of the present technology is a transmission method including inputting an electrical signal from a metal wire to a multi-mode waveguide via a matching structure used to perform impedance matching between the metal wire and the multi-mode waveguide, and outputting an electrical signal from the multi-mode waveguide to another metal wire via another matching structure.

According to the first aspect described above, electrical signals are inputted and outputted between the multi-mode waveguide and the metal wire via the matching structure.

A transmission line according to a second transmission line of the present technology that includes a multi-mode waveguide and a metal wire configured to transmit an electrical signal, wherein the multi-mode waveguide and the metal wire are connected directly to each other.

A transmission method according to a second transmission method of the present technology that allows an electrical signal to be inputted directly to a multi-mode waveguide from a metal wire and allows an electrical signal to be outputted directly to another metal wire from the multi-mode waveguide.

According to the second aspect described above, electrical signals are inputted and outputted directly between the multi-mode waveguide and the metal wire.

Advantageous Effects of Invention

According to the embodiments of the present technology, it is possible to perform multi-mode transmission intended for electrical signals easily.

DESCRIPTION OF EMBODIMENTS

The following describes embodiments of the present technology, but before describing embodiments, multi-mode transmission intended for light will be briefly described in advance.

[Multi-Mode Transmission Intended for Light]

Figure 1:
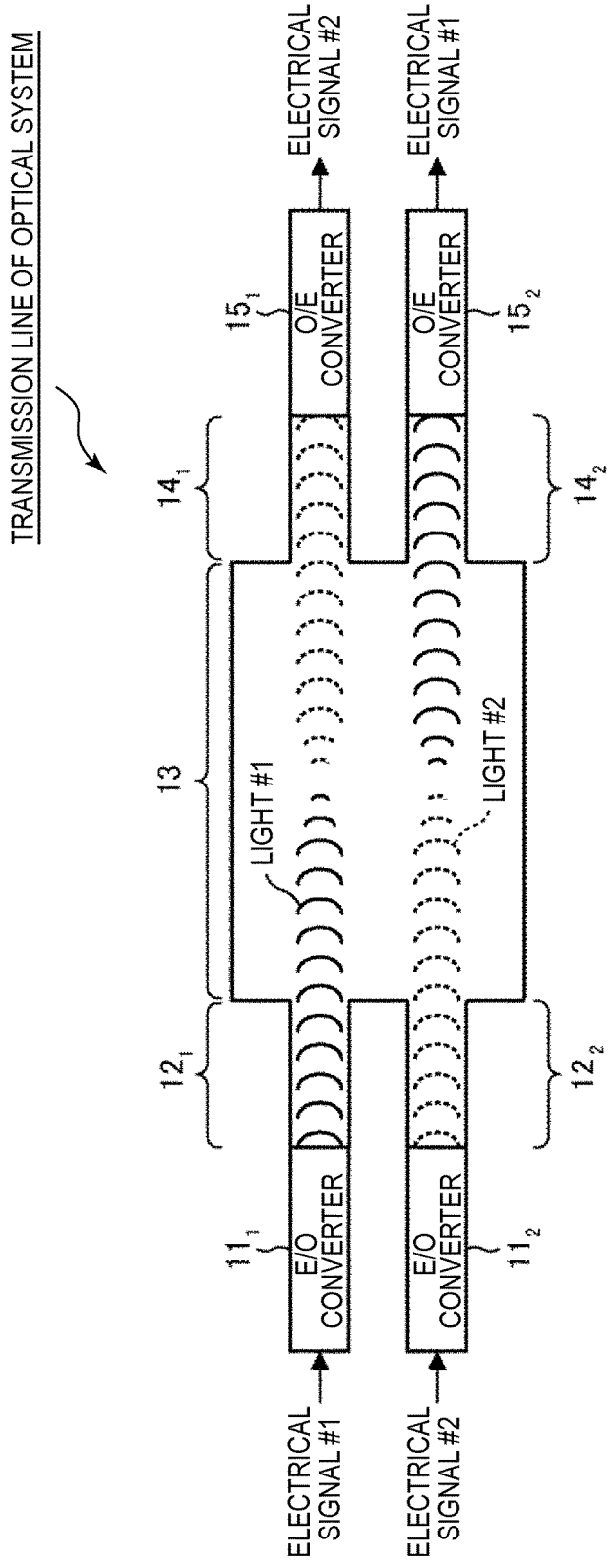
FIG. 1 is a diagram illustrating an exemplary configuration of a transmission line in an optical system.

FIG. 1 is a diagram illustrating an exemplary configuration of a transmission line in an optical system.

In FIG. 1, the transmission line is a transmission channel that performs 2-input and 2-output multi-mode transmission using light as a transmission target, and it includes single-mode waveguides $12_1$ and $12_2$, a multi-mode waveguide 13, and single-mode waveguides $14_1$ and $14_2$.

The single-mode waveguide $12_1$ is disposed at the upper left side in the figure of the multi-mode waveguide 13 having a substantially rectangular cross section, the single-mode waveguide $12_2$ is disposed at the lower left side in the figure of the multi-mode waveguide 13, the single-mode waveguide $14_1$ is disposed at the upper right side in the figure of the multi-mode waveguide 13, and the single-mode waveguide $14_2$ is disposed at the lower right side in the figure of the multi-mode waveguide 13.

The single-mode waveguide $12_1$ is connected with an E/O (electrical-to-optical) converter $11_1$, and the single-mode waveguide $12_2$ is connected with an E/O converter $11_2$.

The E/O converter $11_1$ emits a light #1 that corresponds to an electrical signal #1 in accordance with the electrical signal #1 supplied from the outside.

Similarly, the E/O converter $11_2$ emits a light #2 that corresponds to an electrical signal #2 in accordance with the electrical signal #2 supplied from the outside.

The single-mode waveguides $12_1$ and $12_2$ are single-mode optical fibers or the like acting as an interface that inputs (make incident) light into the multi-mode waveguide 13 that is a multi-mode optical fiber or the like, and the light transmitted through each of the single-mode waveguide $12_1$ and $12_2$ is inputted to the multi-mode waveguide 13.

Thus, the light #1 emitted by the E/O converter $11_1$ is transmitted through the single-mode waveguide $12_1$ and is inputted to the multi-mode waveguide 13. Similarly, the light #2 emitted by the E/O converter $11_2$ is transmitted through the single-mode waveguide $12_2$ and is inputted to the multi-mode waveguide 13.

The light #1, which is inputted to the multi-mode waveguide 13 from the single-mode waveguide $12_1$ disposed at the upper left of the multi-mode waveguide 13, is transmitted through the multi-mode waveguide 13 and reaches the lower right in FIG. 1 of the multi-mode waveguide 13.

At the lower right of the multi-mode waveguide 13, the single-mode waveguide $14_2$ that is a single-mode optical fiber or the like acting as an interface which outputs (emits) light from the multi-mode waveguide 13 is disposed.

Thus, the light #1, which is transmitted through the multi-mode waveguide 13 and reaches the lower right of the multi-mode waveguide 13, is outputted to the single-mode waveguide $14_2$ and is transmitted through the single-mode waveguide $14_2$.

The single-mode waveguide $14_2$ is connected with an O/E (optical-to-electrical) converter $15_2$, and the light #1 transmitted through the single-mode waveguide $14_2$ reaches the O/E converter $15_2$.

The O/E converter $15_2$ receives the light #1 transmitted from the single-mode waveguide $14_2$ and outputs the electrical signal #1 corresponding to the light #1.

On the other hand, the light #2, which is inputted to the multi-mode waveguide 13 from the single-mode waveguide $12_2$ disposed at the lower left of the multi-mode waveguide 13, is transmitted through the multi-mode waveguide 13 and reaches the upper right in FIG. 1 of the multi-mode waveguide 13.

At the upper right of the multi-mode waveguide 13, the single-mode waveguide $14_1$ that is a single-mode optical fiber or the like acting as an interface which outputs (emits) light from the multi-mode waveguide 13 is disposed.

Thus, the light #2, which is transmitted through the multi-mode waveguide 13 and reaches the upper right of the multi-mode waveguide 13, is outputted to the single-mode waveguide $14_1$ and is transmitted through the single-mode waveguide $14_1$.

The single-mode waveguide $14_1$ is connected with an O/E converter $15_1$, and the light #2 transmitted through the single-mode waveguide $14_1$ reaches the O/E converter $15_1$.

The O/E converter $15_1$ receives the light #2 transmitted from the single-mode waveguide $14_1$ and outputs the electrical signal #2 corresponding to the light #2.

It should be noted that, the E/O converters $11_1$ and $11_2$ and the O/E converters $15_1$ and $15_2$ are all so-called active circuits requiring a power supply.

Moreover, in FIG. 1, the position where the light inputted from the left side of the multi-mode waveguide 13 reaches the right side of the multi-mode waveguide 13 is determined by the size (structure) or the like of the multi-mode waveguide 13.

When the transmission line in the optical system of FIG. 1 is used, for example, to transmit millimeter waves that are electrical signals in a millimeter wave band, that is, electrical signals of frequencies between approximately 30 and approximately 300 GHz (wavelengths between approximately 1 and approximately 10 millimeters) without any change, the electrical signals have a longer wavelength than light, and thus a problem may occur.

For example, the transmission of millimeter waves with a longer wavelength causes the single-mode waveguides $12_1$ and $12_2$ and the single-mode waveguides $14_1$ and $14_2$ (or waveguides equivalent to these waveguides) to be increased in size and thus the entire transmission line to be increased in size.

Furthermore, millimeter waves having a longer wavelength are easy to leak out from a waveguide, as compared to light having a shorter wavelength. For this reason, if the single-mode waveguides $12_1$ and $12_2$ or the single-mode waveguides $14_1$ and $14_2$ (or waveguides equivalent to these waveguides) are arranged close together, a signal leaking from one single-mode waveguide interferes with a signal transmitted through the other single-mode waveguide which is disposed at a position close to the one single-mode waveguide.

To prevent such interference, it is necessary to impose a constraint on arrangement in which one single-mode waveguide for inputting and outputting signals to and from the multi-mode waveguide 13 (or an equivalent waveguide) to be spaced apart from the other single-mode waveguide to some extent.

However, in multi-mode transmission, there is a positional relationship between the position (hereinafter, also referred to as an input position) of the multi-mode waveguide 13 (or an equivalent waveguide) to which signals are inputted and the position (hereinafter, also referred to as an output position) of the multi-mode waveguide 13 where a signal inputted from the input position is transmitted through the multi-mode waveguide 13 and then reaches, and this positional relationship is determined by the wavelength of the signal or the size of the multi-mode waveguide 13.

Thus, if the arrangement constraint is imposed on the single-mode waveguides $12_1$ and $12_2$ or the single-mode waveguides $14_1$ and $14_2$ (or waveguides equivalent to these waveguides), it may be difficult to provide the single-mode waveguide $12_1$ or $12_2$ to a desired input position, or to provide the single-mode waveguide $14_1$ or $14_2$ to a desired output position.

Therefore, according to an embodiment of the present technology, a transmission line that allows multi-mode transmission intended for electrical signals to be performed easily is proposed.

[First Embodiment of Transmission Line to which the Present Technology is Applied]

Figure 2:
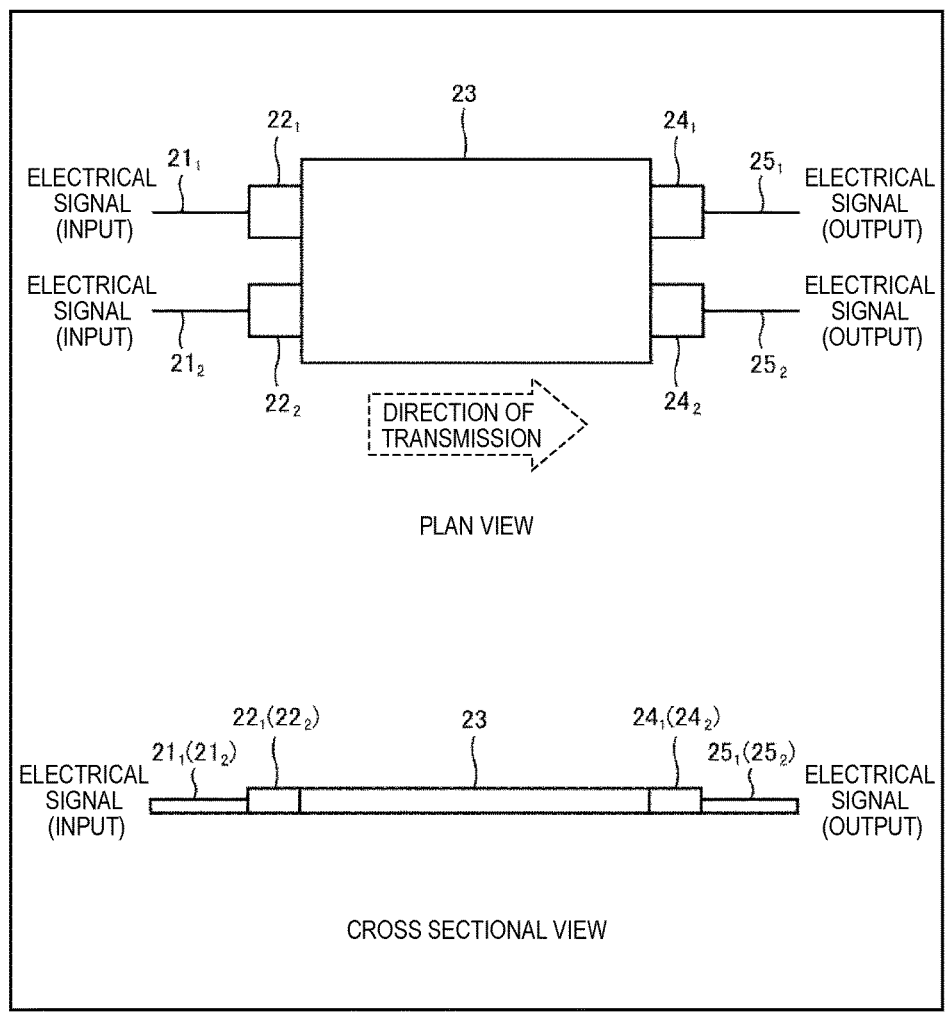
FIG. 2 illustrates an exemplary configuration of a first embodiment of a transmission line to which the present technology is applied in plan and cross sectional views.

FIG. 2 illustrates an exemplary configuration of a first embodiment of a transmission line to which the present technology is applied in plan and cross sectional views.

In FIG. 2, the transmission line may be a transmission channel that performs 2-input and 2-output multi-mode transmission intended for electrical signals such as millimeter waves, and it includes metal wires $21_1$ and $21_2$, matching structures $22_1$ and $22_2$, a multi-mode waveguide 23, matching structures $24_1$ and $24_2$, and metal wires $25_1$ and $25_2$.

The metal wire $21_i$ (where i=1 or 2, in FIG. 2) is, for example, copper wire whose cross section is cylindrical or the like, and for example, a millimeter wave supplied from a millimeter-wave transmission circuit, not illustrated, for transmitting millimeter waves is transmitted to the metal wire $21_i$.

The metal wire $21_i$ (where i=1 or 2, in FIG. 2) is connected to the matching structure $22_i$, and the matching structure $22_i$ is connected to the multi-mode waveguide 23.

Thus, the millimeter wave transmitted through the metal wire $21_i$ is inputted to the multi-mode waveguide 23 via the matching structure $22_i$.

The matching structure $22_i$ is a circuit or the like for matching the impedance between the metal wire $21_i$ and the multi-mode waveguide 23. As the matching structure $22_i$, there can be employed a passive circuit (for example, a bonding wire or the like of approximately 1 millimeter (mm) acting as an antenna for millimeter waves) which prevents reflection between the metal wire $21_i$ and the multi-mode waveguide 23, for example, that is a dielectric waveguide or the like as described later and thus can transmit and receive millimeter waves efficiently.

The multi-mode waveguide 23 is, for example, a dielectric waveguide or the like of a rectangular plate shape, and the metal wire $21_i$ is connected to the left side of the multi-mode waveguide 23 via the matching structure $22_i$.

Thus, the millimeter wave inputted to the multi-mode waveguide 23 via the matching structure $22_i$ from the metal wire $21_i$ is transmitted through the multi-mode waveguide 23 from left to right.

The matching structure $24_i$ is connected to the right side of the multi-mode waveguide 23, and the metal wire $25_i$ is connected to the matching structure $24_i$.

The matching structure $24_i$ is configured in a similar way to the matching structure $22_i$, and provides impedance matching between the multi-mode waveguide 23 and the metal wire $25_i$.

The metal wire $25_i$ is configured in a similar way to the metal wire $21_i$.

The millimeter waves inputted to the multi-mode waveguide 23 from the metal wire $21_i$ via the matching structure $22_i$ transmit through the multi-mode waveguide 23 from left to right. Then, the millimeter waves arrive at the right side of the multi-mode waveguide 23, and the millimeter wave, which is arrived at the position where the matching structure $24_i$ is disposed from among the millimeter waves arrived at the right side of the multi-mode waveguide 23, is outputted to the metal wire $25_i$ via the matching structure $24_i$.

The millimeter wave outputted to the metal wire $25_i$ is transmitted through the metal wire $25_i$ and then is supplied, for example, to a millimeter-wave reception circuit, not illustrated, for receiving millimeter waves.

Note that, in FIG. 2, the metal wire $21_i$, the matching structure $22_i$, the multi-mode waveguide 23, the matching structure $24_i$, and the metal wire $25_i$ are arranged to be aligned on a plane as shown in the cross sectional view (the cross sectional view taken perpendicular to the plan view).

Furthermore, in the plan view of FIG. 2, the matching structures $22_1$, $22_2$, $24_1$, and $24_2$ are disposed at the upper left, the lower left, the upper right, and the lower right, respectively, of the multi-mode waveguide 23.

In the transmission line configured in this way, the millimeter wave is inputted to the multi-mode waveguide 23 from the metal wire $21_i$ via the matching structure $22_i$ and is transmitted in the direction from left to right in the figure. Then, the millimeter wave, which is arrived at the position where the matching structure $24_i$ is disposed from among the millimeter waves arrived at the right side of the multi-mode waveguide 23, is outputted from the multi-mode waveguide 23 to the metal wire $25_i$ via the matching structure $24_i$.

In the transmission line of FIG. 2, the metal wire $21_i$ and the matching structure $22_i$ and the matching structure $24_i$ and the metal wire $25_i$ are provided, instead of the single-mode waveguides $12_1$ and $12_2$, and $14_1$ and $14_2$ of the transmission line of FIG. 1, and thus it is possible to perform easily multi-mode transmission intended for electrical signals such as millimeter waves.

In other words, the metal wire $21_i$ and the matching structure $22_i$, and the matching structure $24_i$ and the metal wire $25_i$ can be configured in a smaller size than the single-mode waveguides $12_1$ and $12_2$, and $14_1$, and $14_2$ (or waveguides equivalent to those), and thus it is possible for the transmission line to be configured in a more compact form than when the transmission line in the optical system of FIG. 1 is used to transmit millimeter waves without change.

In addition, in the transmission line of FIG. 2, it is unnecessary to provide the single-mode waveguides $12_1$ and $12_2$, and $14_1$ and $14_2$ (waveguides for millimeter wave equivalent to those) of the transmission line in FIG. 1, and thus there is no possibility that the arrangement of the single-mode waveguides $12_1$ and $12_2$, and $14_1$ and $14_2$ (waveguides for millimeter wave equivalent to those) is constrained to prevent any interference caused by the leakage of millimeter waves from a waveguide as described with reference to FIG. 1.

In other words, the matching structures $22_i$ and $24_i$ can be arranged at any position in the multi-mode waveguide 23 without being subject to a constraint on arrangement to prevent interference.

Furthermore, the arrangement of the matching structures $22_i$ and $24_i$ (even the metal wires $21_i$ and $25_i$ connected to the matching structures $22_i$ and $24_i$, respectively) is not constrained, and thus it is possible to add a desired function as described later to the transmission line.

Note that, in FIG. 2, the matching structure $22_i$ is provided to match the impedance between the metal wire $21_i$ and the multi-mode waveguide 23, but, for example, when the impedance is matched (substantially) between the metal wire $21_i$ and the multi-mode waveguide 23, or when the reflection of millimeter waves in a case where the metal wire $21_i$ is connected directly to the multi-mode waveguide 23 is negligible, it is possible to connect the metal wire $21_i$ directly to the multi-mode waveguide 23 without providing the matching structure $22_i$. Similarly, it is possible to connect the multi-mode waveguide 23 directly to the metal wire $25_i$ without providing the matching structure $24_i$.

In this case, the millimeter wave is inputted directly to the multi-mode waveguide 23 from the metal wire $21_i$ and is transmitted in the direction from left to right in the figure. Then, the millimeter wave, which is arrived at the position where the metal wire $25_i$ is disposed from among the millimeter waves arrived at the right side of the multi-mode waveguide 23, is outputted directly to the metal wire $25_i$ from the multi-mode waveguide 23.

As described above, when the metal wires $21_i$ and $25_i$ are connected directly to the multi-mode waveguide 23 without providing the matching structures $22_i$ and $24_i$, the matching structures 22i and 24i are not provided and thus the transmission line can be configured to be compact accordingly.

[Second Embodiment of Transmission Line to which the Present Technology is Applied]

Figure 3:
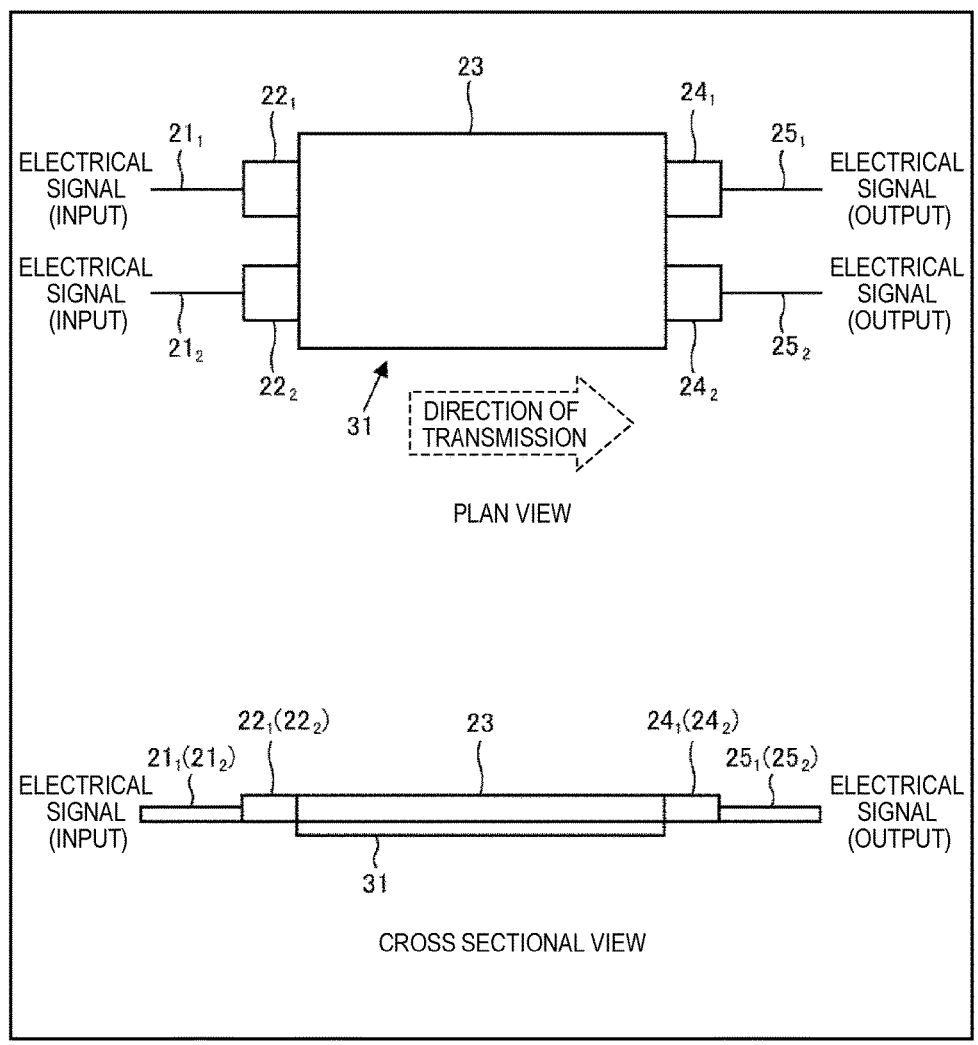
FIG. 3 illustrates an exemplary configuration of a second embodiment of a transmission line to which the present technology is applied in plan and cross sectional views.

FIG. 3 illustrates an exemplary configuration of a second embodiment of the transmission line to which the present technology is applied in plan and cross sectional views.

It should be noted that, in the figure, portions corresponding to those of FIG. 2 are denoted with the same reference signs, and, in the following, explanations thereof will be omitted appropriately.

In FIG. 3, the transmission line is similar to that of FIG. 2 in that there are provided components from the metal wire $21_i$ to the metal wire $25_i$, but the transmission line of FIG. 3 is different from that of FIG. 2 in that there is provided an additional metal plate 31.

In FIG. 3, the planar metal plate 31 is provided to be in contact with one surface of the planar multi-mode waveguide 23.

In this case, it is possible to prevent millimeter waves from leaking out of the surface of the multi-mode waveguide 23 which is in contact with the metal plate.

Note that, in the transmission line of FIG. 3, as with the case described in FIG. 2, it is possible to connect each of the metal wires $21_i$ and $25_i$ directly to the multi-mode waveguide 23 without providing the matching structures $22_i$ and $24_i$.

Figure 4:
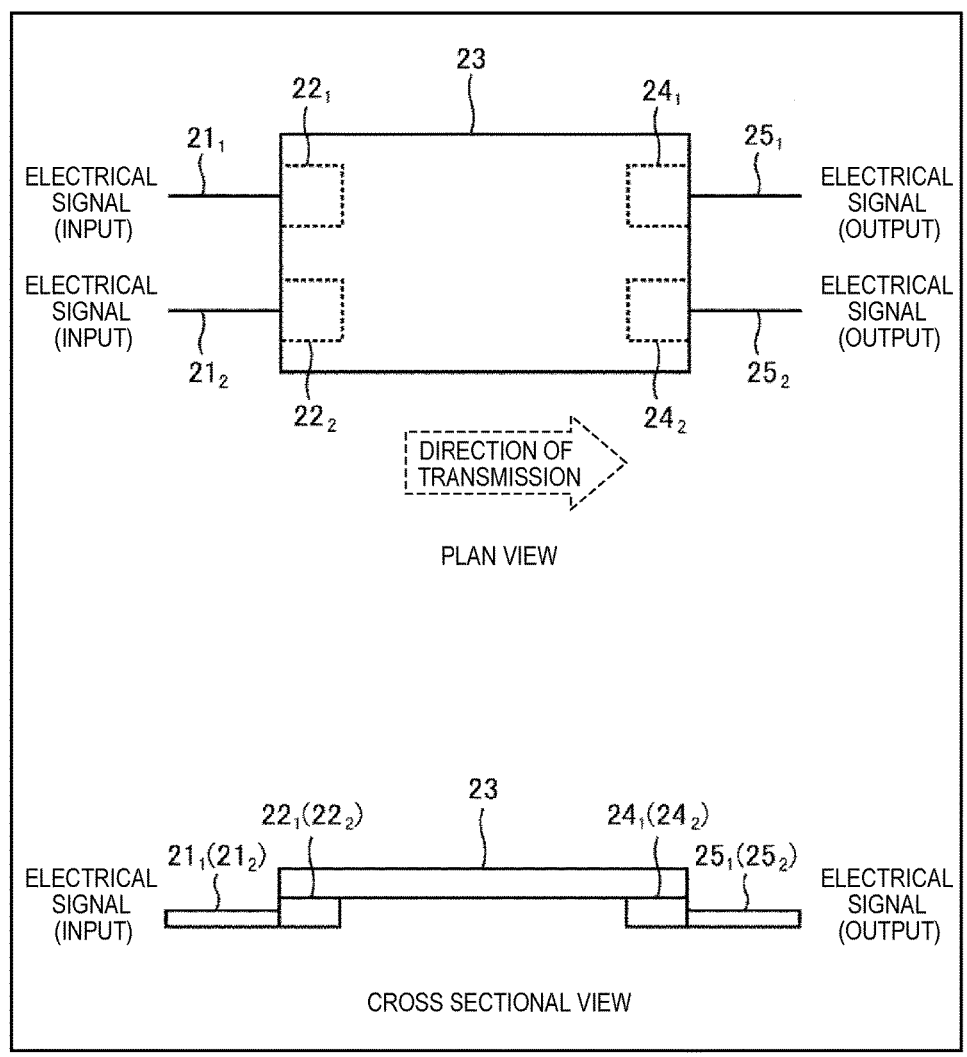
FIG. 4 illustrates an exemplary configuration of a third embodiment of a transmission line to which the present technology is applied in plan and cross sectional views.

Third Embodiment of Transmission Line to which the Present Technology is Applied FIG. 4 illustrates an exemplary configuration of a third embodiment of the transmission line to which the present technology is applied in plan and cross sectional views.

It should be noted that, in the figure, portions corresponding to those of FIG. 2 are denoted with the same reference signs, and, in the following, explanations thereof will be omitted appropriately.

In FIG. 4, the transmission line is similar to the transmission line of FIG. 2, in that there are provided components from the metal wire $21_i$ to the metal wire $25_i$.

However, the transmission line of FIG. 4 is different from that of FIG. 2, in that the transmission line of FIG. 4 includes the matching structures $21_i$ and $24_i$ and the multi-mode waveguide 23 which are arranged to be stacked on each other, but the transmission line of FIG. 2 includes the matching structures $21_i$ and $24_i$ and the multi-mode waveguide 23 which are arranged to be aligned with each other on a plane.

In the transmission line of FIG. 4, the planar multi-mode waveguide 23 is disposed on the matching structures $22_i$ and $24_i$ to cover the entire matching structures $22_i$ and $24_i$ (the matching structures $22_i$ and $24_i$ are to be hidden), and thus the transmission line can be configured to be compact as the matching structures $22_i$ and $24_i$ are hidden by the multi-mode waveguide 23.

Here, in the following, the present technology will be described as an example of the transmission line which is provided with the matching structures $22_i$ and $24_i$, however, the present technology described below can be applied to the transmission line in which the metal wires $21_i$ and $25_i$ are connected directly to the multi-mode waveguide 23 without providing the matching structures $22_i$ and $24_i$.

[Functions Capable of being Added to Transmission Line]

Figure 5:
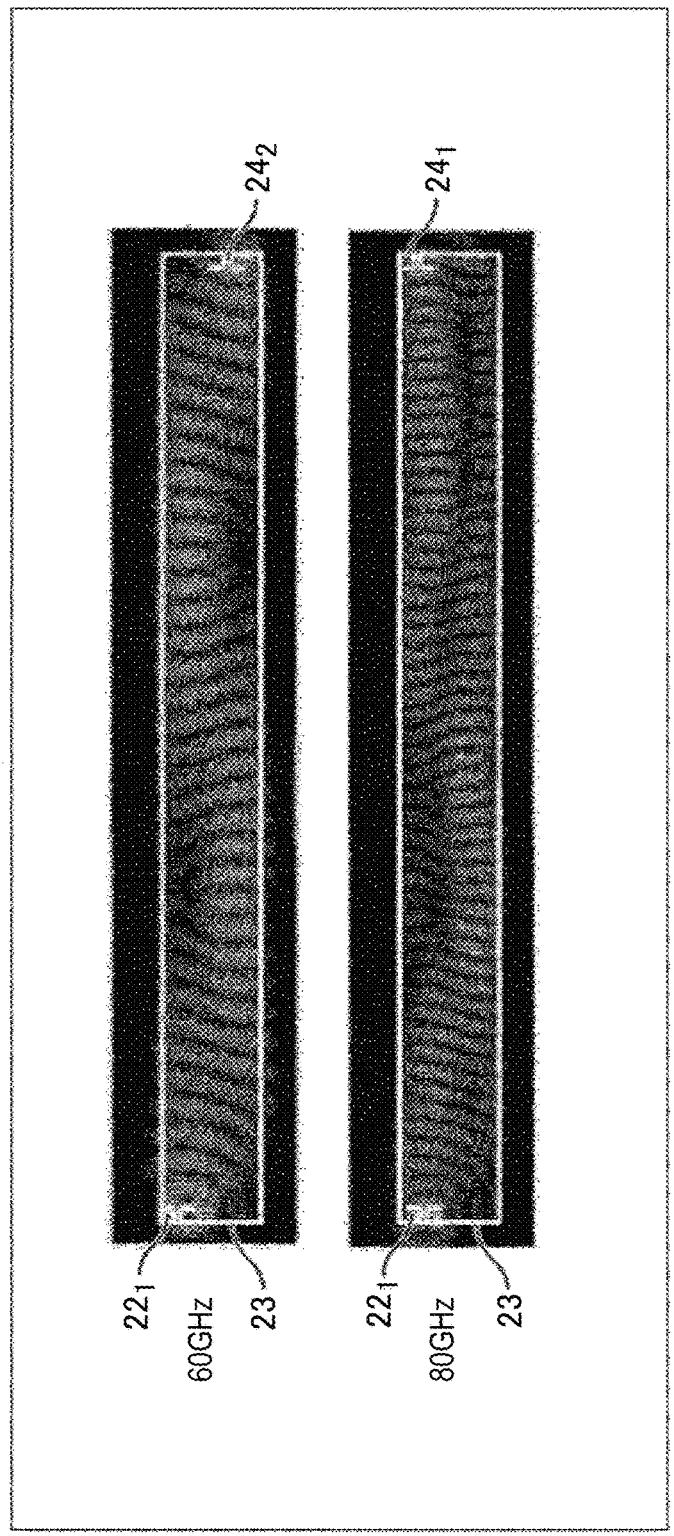
FIG. 5 is a diagram for explaining a function that can be provided to the transmission line to which the present technology is applied.

FIG. 5 is a diagram for explaining a function capable of being added to the transmission line to which the present technology is applied.

In multi-mode transmission through the multi-mode waveguide 23, there is a positional relationship between the input position at which millimeter waves are inputted to the multi-mode waveguide 23 and the output position of the multi-mode waveguide 23 at which the millimeter wave inputted from the input position is transmitted through the multi-mode waveguide 23 and then is arrived, and this positional relationship is determined by the wavelength of the signal or the size (structure) of the multi-mode waveguide 23.

FIG. 5 shows a result obtained by performing electromagnetic field analysis in a case where a rectangular plate-shaped dielectric waveguide of a predetermined size is employed as the multi-mode waveguide 23 and where millimeter waves of 60 and 80 GHz are employed as input signals inputted from the metal wire $21_i$ to the multi-mode waveguide 23 via the matching structure $22_i$.

In FIG. 5, both the millimeter waves of 60 and 80 GHz are inputted to the multi-mode waveguide 23 from the matching structure $22_1$ disposed at the upper left of the multi-mode waveguide 23.

Both the millimeter waves of 60 and 80 GHz inputted to the multi-mode waveguide 23 have an electric field intensity distribution in a meandering pattern, are transmitted (propagated) through the multi-mode waveguide 23 from left to right side, and then are arrived at the right side of the multi-mode waveguide 23.

In FIG. 5, the 60-GHz millimeter wave reaches the position at the lower right of the multi-mode waveguide 23 (the position at which the matching structure $24_2$ is arranged), and the 80-GHz millimeter wave reaches the position at the upper right of the multi-mode waveguide 23 (the position at which the matching structure $24_1$ is arranged).

Thus, the 60-GHz millimeter wave, which is arrived at the lower right of the multi-mode waveguide 23, is outputted from the lower right of the multi-mode waveguide 23 via the matching structure $24_2$ disposed at the lower right of the multi-mode waveguide 23. Similarly, the 80-GHz millimeter wave, which is arrived at the upper right of the multi-mode waveguide 23, is outputted from the upper right of the multi-mode waveguide 23 via the matching structure $24_1$ disposed at the upper right of the multi-mode waveguide 23.

As described above, the 60-GHz millimeter wave, which is inputted to the multi-mode waveguide 23 from the matching structure $22_1$ (the metal wire $21_1$ connected to this matching structure) disposed at the upper left of the multi-mode waveguide 23, is outputted to the matching structure $24_2$ (the metal wire $25_2$ connected to this matching structure) disposed at the lower right of the multi-mode waveguide 23. In addition, the 80-GHz millimeter wave, which is inputted to the multi-mode waveguide 23 from the matching structure $22_1$ disposed at the upper left of the multi-mode waveguide 23, is outputted to the matching structure $24_1$ (the metal wire $25_1$ connected to this matching structure) disposed at the upper right of the multi-mode waveguide 23.

Thus, when a multiplexed signal obtained by multiplexing (mixing) the 60- and 80-GHz millimeter waves is inputted from the matching structure $22_1$, the 60-GHz millimeter wave included in the multiplexed signal is outputted from the matching structure $24_2$ and the 80-GHz millimeter wave included in the multiplexed signal is outputted from the matching structure $24_1$.

In this case, the transmission line functions as a demultiplexer that splits the multiplexed signal obtained by multiplexing the 60- and 80-GHz millimeter waves into the 60-GHz millimeter wave and the 80-GHz millimeter wave, and thus it is possible to add a function of demultiplexing.

As descried above, the transmission line to which the present technology is applied can be added with the function of demultiplexing, and besides, it can be added with other functions, for example, including a function of mixing (combining), a function of switching, and a function of crossing.

Figure 6:
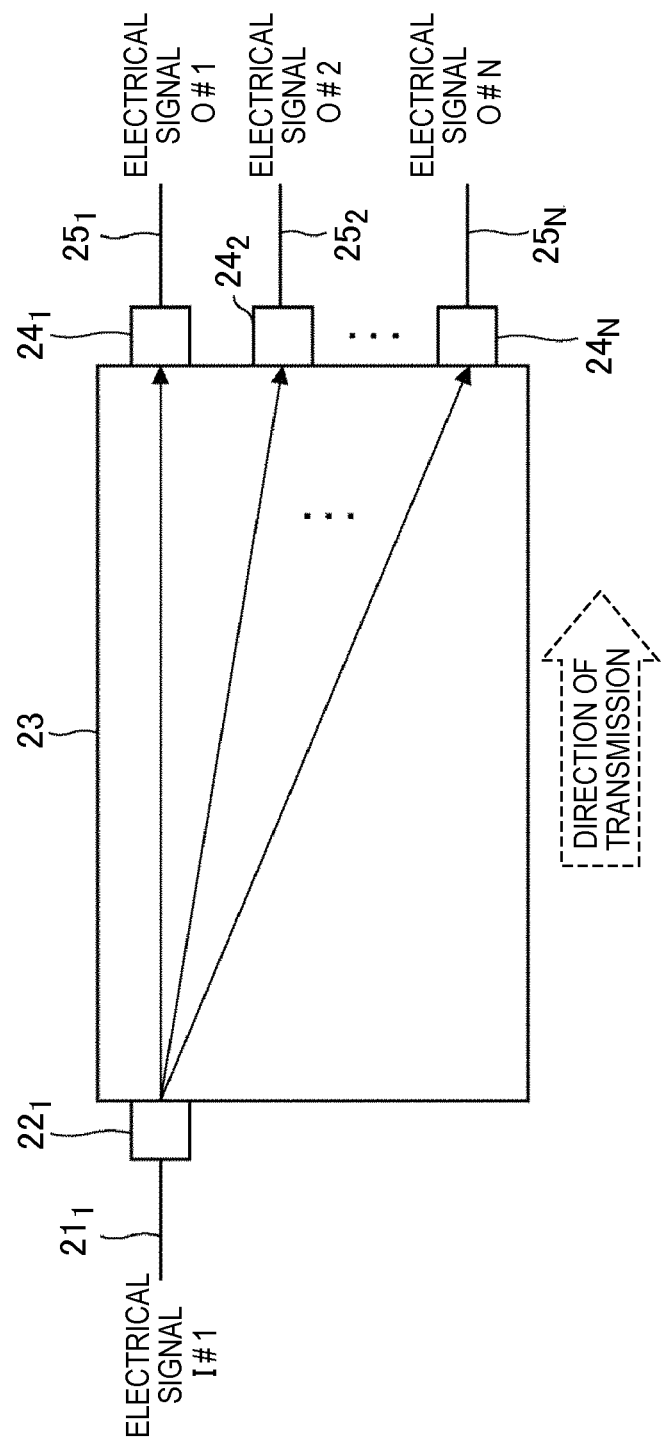
FIG. 6 is a plan view illustrating an exemplary configuration of an embodiment of a 1-input and N-output transmission line which is added with a demultiplexing function.

FIG. 6 is a plan view illustrating an exemplary configuration of an embodiment of a 1-input and N-output transmission line which is added with the function of demultiplexing.

It should be noted that, in FIG. 6, portions corresponding to those of FIG. 2 are denoted with the same reference signs, and, in the following, explanations thereof will be omitted appropriately.

In FIG. 6, a single input metal wire $21_1$ to which a multiplexed signal (electrical signal) I#1 obtained by multiplexing signals O#1, O#2, . . . , O#N that are millimeter waves of a plurality of different frequencies (bands) f#1, f#2, . . . , f#N is inputted is connected to the upper portion of the left side (the upper left) of the multi-mode waveguide 23 via the matching structure $22_1$ for performing impedance matching.

Furthermore, in FIG. 6, the plurality of N output metal wires $25_1$, $25_2$, . . . , $25_N$ from which signals O#1, O#2, . . . , O#N of a plurality of frequencies f#1, f#2, . . . , f#N are outputted, respectively, are connected to different positions of the right side of the multi-mode waveguide 23 via the matching structures $24_1$, $24_2$, . . . , $24_N$, respectively, for performing impedance matching.

In this example, in FIG. 6, the size of the multi-mode waveguide 23 and the positions of the matching structures $22_1$ and $25_1$ to $25_N$ are set (designed) such that, when a signal O#n of a frequency f#n (where n=1, 2, . . . , N) is inputted to the multi-mode waveguide 23 from the position of the matching structure $22_1$, the signal O#n is transmitted through the multi-mode waveguide 23 and reaches the position of the matching structure $24_n$.

In the transmission line of FIG. 6, when the multiplexed signal I#1 obtained by multiplexing signals O#1 to O#N of a plurality of N frequencies f#1 to f#N is inputted to the multi-mode waveguide 23 from the metal wire $21_1$ via the matching structure $22_1$, a signal O#n of the signals O#1 to O#N included in the multiplexed signal I#1 is transmitted through the multi-mode waveguide 23, reaches the position of the matching structure $24_n$, and is outputted to the metal wire $25_n$ via the matching structure $24_n$.

Thus, the transmission line of FIG. 6 have the function of demultiplexing that splits the multiplexed signal I#1 into the signals O#1 to O#N.

Figure 7:
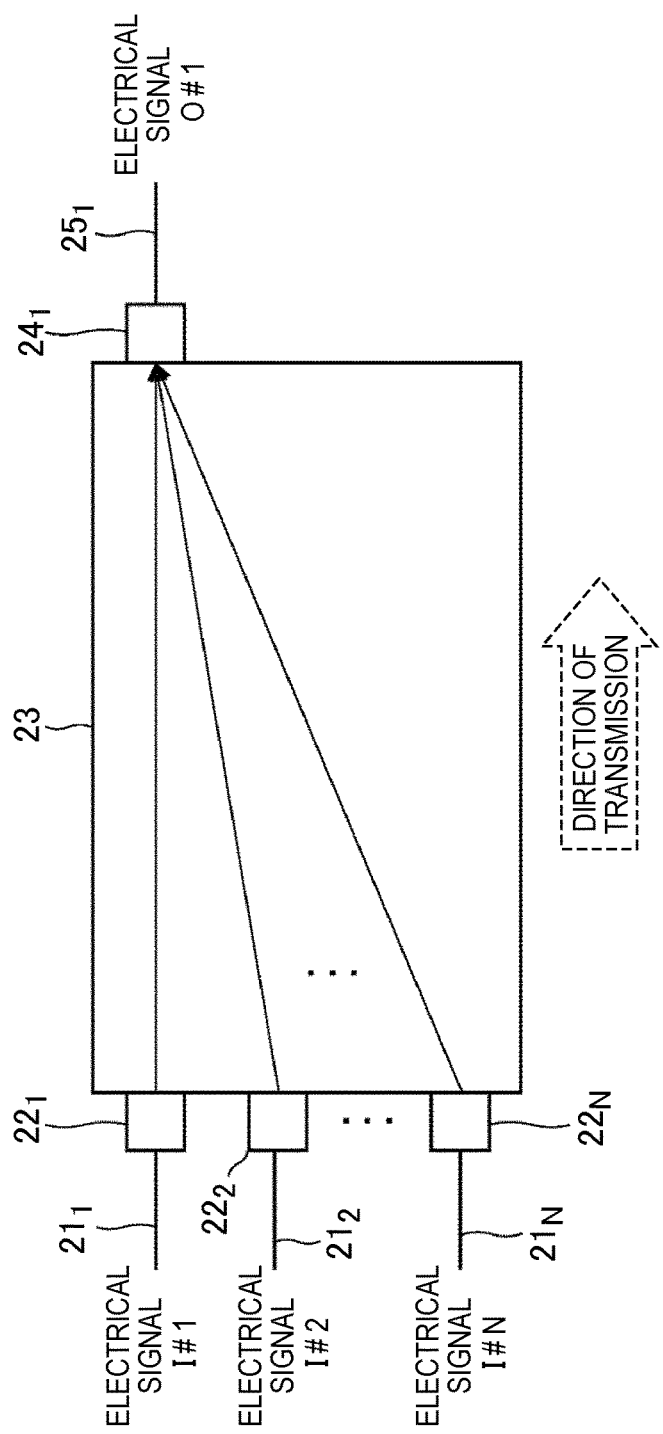
FIG. 7 is a plan view illustrating an exemplary configuration of an embodiment of an N-input and 1-output transmission line which is added with a mixing function.

FIG. 7 is a plan view illustrating an exemplary configuration of an embodiment of N-input and 1-output transmission line which is added with the function of mixing.

It should be noted that, in FIG. 7, portions corresponding to those of FIG. 2 are denoted with the same reference signs, and, in the following, explanations thereof will be omitted appropriately.

In FIG. 7, the N input metal wires $21_1$, $21_2$, . . . , $21_N$ to which signals I#1, I#2, . . . , I#N that are millimeter waves of a plurality of different frequencies (bands) f#1, f#2, . . . , f#N are inputted are connected to different positions of the left side of the multi-mode waveguide 23 via the matching structures $22_1$, $22_2$, . . . , $22_N$, respectively, for performing impedance matching.

Furthermore, in FIG. 7, the single output metal wire $25_1$ from which a multiplexed signal O#1 obtained by multiplexing signals I#1, I#2, . . . , I#N of a plurality of frequencies f#1, f#2, . . . , f#N is outputted is connected to the upper portion of the right side (the upper right) of the multi-mode waveguide 23 via the matching structure $24_1$ for performing impedance matching.

In this example, in FIG. 7, the size of the multi-mode waveguide 23 and the positions of the matching structures $22_1$ to $22_N$ and $25_1$ are set such that, when a signal I#n of a frequency f#n is inputted to the multi-mode waveguide 23 from the position of the matching structure $22_n$, the signal I#n is transmitted through the multi-mode waveguide 23 and reaches the position of the matching structure $24_1$.

In the transmission line of FIG. 7, when the signals I#1 to I#N of the plurality of N frequencies f#1 to f#N are inputted to the multi-mode waveguide 23 from the metal wires $21_1$ to $21_N$ via the matching structures $22_1$ to $22_N$, respectively, all of the signals I#1 to I#N are transmitted through the multi-mode waveguide 23, reach the position of the matching structure $24_1$, and are outputted to the metal wire $25_1$ as the signal O#1 via the matching structure $24_1$.

Thus, the transmission line of FIG. 7 has the function of mixing that multiplexes (mixes) the signals I#1 to I#N of the plurality of different frequencies f#1 to f#N and outputs the signal O#1 obtained by multiplexing the signals I#1 to I#N to the metal wire $25_1$.

Figure 8:
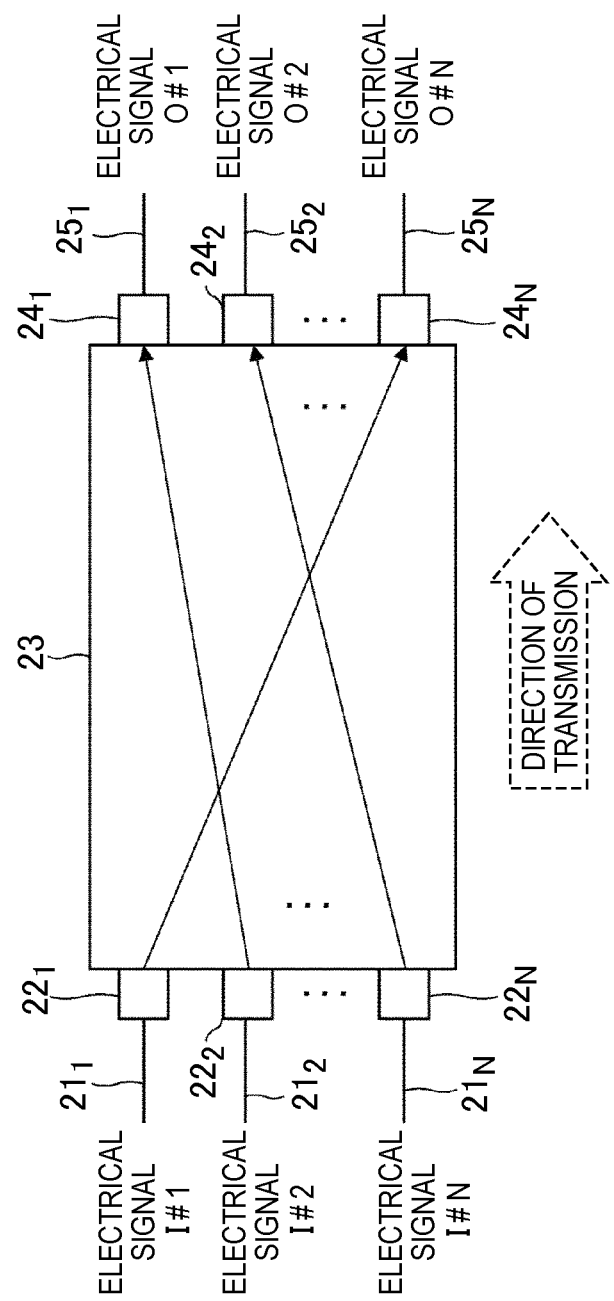
FIG. 8 is a plan view illustrating an exemplary configuration of an embodiment of an N-input and N-output transmission line which is added with a switching (or crossing) function.

FIG. 8 is a plan view illustrating an exemplary configuration of an embodiment of an N-input and N-output transmission line which is added with a switching function.

It should be noted that, in FIG. 8, portions corresponding to those of FIG. 2 are denoted with the same reference signs, and, in the following, explanations thereof will be omitted appropriately.

In FIG. 8, the N input metal wires $21_1$ to $21_N$ to which the plurality of signals I#1 to I#N that are millimeter waves are inputted are connected to different positions of the left side of the multi-mode waveguide 23 via the matching structures $22_1$ to $22_N$, respectively, for performing impedance matching.

Furthermore, in FIG. 8, the N output metal wires $25_1$ to $25_N$ from which the plurality of signals O#1 to O#N that are millimeter waves are outputted are connected to different positions of the right side of the multi-mode waveguide 23 via the matching structures $24_1$ to $24_N$, respectively, for performing impedance matching.

In this example, in FIG. 8, the size of the multi-mode waveguide 23 and the positions of the matching structures $22_1$ to $22_N$ and $24_1$ to $24_N$ are set such that, when a signal I#n of a frequency f#n is inputted to the multi-mode waveguide 23 from the position of the matching structure $22_n$, the signal I#n is transmitted through the multi-mode waveguide 23 and reaches the position of the matching structure $24_{n'}$' (where n'=1, 2, . . . , N, and if n'=n1' for any n=n1, then n' is different from n'=n2' for n=n2 not equal to n1).

In the transmission line of FIG. 8, when a signal I#n of a certain frequency f#n is inputted to the multi-mode waveguide 23 from a metal wire $21_n$ via a matching structure $22_n$, the signal I#n is transmitted through the multi-mode waveguide 23, reaches the position of a matching structure $24_{n'}$', and is outputted to a metal wire $25_{n'}$' as a signal O#n' via the matching structure $24_{n'}$'.

Thus, when the signals I#1 to I#N of the plurality of different frequencies f#1 to f#N are inputted, the transmission line of FIG. 8 has the switching function that outputs the signal I#n of the frequency f#n inputted from the position of the matching structure $22_n$ as a signal O#n' from the position of a matching structure $24_{n'}$', that is, the function of rearranging the sequence of the signals I#1 to I#N of the plurality of different frequencies f#1 to f#N.

In addition, in FIG. 8, the size of the multi-mode waveguide 23 and the positions of the matching structures $22_1$ to $22_N$ and $24_1$ to $24_N$ can be set such that, when a signal I#n of a given frequency F is inputted to the multi-mode waveguide 23 from the position of the matching structure $22_n$, the signal I#n is transmitted through the multi-mode waveguide 23 and reaches the position of the matching structure $24_n'$.

In this case, when the signal I#n of a given frequency F is inputted to the multi-mode waveguide 23 from the metal wire $21_n$ via the matching structure $22_n$, the signal I#n is transmitted through the multi-mode waveguide 23, reaches the position of the matching structure $24_n'$, and is outputted to a metal wire $25_n'$ as a signal O#n' via matching structure $24_n'$.

Thus, when a plurality of signals I#1 to I#N of the same frequency F are inputted, the transmission line of FIG. 8 has the function of crossing that allows the signal I#n inputted from the position of the matching structure $22_n$ to be outputted as a signal O#n' from the position of the matching structure $24_n'$, that is, the function of rearranging the sequence of the plurality of signals I#1 to I#N of the same frequency.

The preferred embodiments of the present invention have been described above with reference to the accompanying drawings, whilst the present invention is not limited to the above examples, of course. A person skilled in the art may find various alterations and modifications within the scope of the appended claims, and it should be understood that they will naturally come under the technical scope of the present invention.

For example, a target to be transmitted through the transmission line may be electrical signals, but is not limited to millimeter waves.

Additionally, the present technology may also be configured as below.

[1]
A transmission line including:
a multi-mode waveguide;
a metal wire configured to transmit an electrical signal; and
a matching structure configured to be connected to the multi-mode waveguide and the metal wire, and configured to perform impedance matching between the multi-mode waveguide and the metal wire.

[2]
The transmission line according to [1], wherein the electrical signal is a signal of a millimeter wave band.

[3]
The transmission line according to [1] or [2], wherein the multi-mode waveguide, the metal wire, and the matching structure are arranged to be aligned on a plane.

[4]
The transmission line according to any one of [1] to [3], further including:
a metal configured to be in contact with the multi-mode waveguide.

[5]
The transmission line according to [1] or [2], wherein the multi-mode waveguide and the matching structure are arranged to be stacked on each other.

[6]
The transmission line according to any one of [1] to [5], wherein the metal wire includes
one input metal wire to which a multiplexed signal is inputted, the multiplexed signal being obtained by multiplexing signals of a plurality of frequency bands, and
a plurality of output metal wires configured to output the respective signals of the plurality of frequency bands.

[7]
The transmission line according to any one of [1] to [5], wherein the metal wire includes
a plurality of input metal wires to which respective signals of a plurality of frequency bands are inputted, and
one output metal wire configured to output a multiplexed signal obtained by multiplexing the signals of the plurality of frequency bands.

[8]
The transmission line according to any one of [1] to [5], wherein the metal wire includes
a plurality of input metal wires to each of which each of a plurality of signals is inputted, and
a plurality of output metal wires each configured to output each of the plurality of signals.

[9]
A transmission method including:
inputting an electrical signal from a metal wire to a multi-mode waveguide via a matching structure used to perform impedance matching between the metal wire and the multi-mode waveguide; and
outputting an electrical signal from the multi-mode waveguide to another metal wire via another matching structure.

[10]
A transmission line including:
a multi-mode waveguide; and
a metal wire configured to transmit an electrical signal,
wherein the multi-mode waveguide and the metal wire are connected directly to each other.

[11]
The transmission line according to [10], wherein the electrical signal is a signal of a millimeter wave band.

[12]
The transmission line according to [10] or [11], wherein the multi-mode waveguide and the metal wire are arranged to be aligned on a plane.

[13]
The transmission line according to any one of [10] to [12], further including:
a metal configured to be in contact with the multi-mode waveguide.

[14]
The transmission line according to any one of [10] to [13], wherein the metal wire includes
one input metal wire to which a multiplexed signal is inputted, the multiplexed signal being obtained by multiplexing signals of a plurality of frequency bands, and
a plurality of output metal wires configured to output the respective signals of the plurality of frequency bands.

[15]
The transmission line according to any one of [10] to [13], wherein the metal wire includes
a plurality of input metal wires to which respective signals of a plurality of frequency bands are inputted, and
one output metal wire configured to output a multiplexed signal obtained by multiplexing the signals of the plurality of frequency bands.

[16]
The transmission line according to any one of [10] to [13], wherein the metal wire includes
a plurality of input metal wires to each of which each of a plurality of signals is inputted, and
a plurality of output metal wires each configured to output each of the plurality of signals.

[17]
A transmission method including:
inputting an electrical signal from a metal wire directly to
a multi-mode waveguide; and

REFERENCE SIGNS LIST $11_1$, $11_2$ E/O converter
$12_1$, $12_2$ single-mode waveguide
13 multi-mode waveguide
$14_1$, $14_2$ single-mode waveguide
$15_1$, $15_2$ O/E converter
$21_1$, $21_2$, ..., $21_N$ metal wire
$22_1$, $22_2$, ..., $22_N$ matching structure
23 multi-mode waveguide
$24_1$, $24_2$, ..., $24_N$ matching structure
$25_1$, $25_2$, ..., $25_N$ metal wire
31 metal plate

The invention claimed is:

1. A transmission line, comprising:
a multi-mode waveguide;
one input metal wire configured to receive a multiplexed input signal that includes a plurality of first signals of a plurality of frequency bands;
a plurality of output metal wires, wherein each of the plurality of output metal wires is configured to output a respective signal of the plurality of first signals; and
at least one of:
a first matching structure between the input metal wire and the multi-mode waveguide, or
at least one second matching structure between the multi-mode waveguide and at least one output metal wire of the plurality of output metal wires,
wherein the first matching structure is configured to match impedance between the input metal wire and multi-mode waveguide, and
wherein the at least one second matching structure is configured to match impedance between the multi-mode wave guide and the at least one output metal wire.

2. The transmission line according to claim 1, wherein each of the plurality of first signals of the multiplexed input signal is a millimeter wave band signal.

3. The transmission line according to claim 1, wherein the multi-mode waveguide, the input metal wire, the plurality of output metal wires, and the at least one of the first matching structure or the at least one second matching structure are aligned on a plane.

4. The transmission line according to claim 1, further comprising a metal in contact with the multi-mode waveguide.

5. The transmission line according to claim 1, wherein the multi-mode waveguide and at least one of the first matching structure or the at least one second matching structure are stacked on each other.

6. A transmission line, comprising:
a multi-mode waveguide; and
a metal wire configured to transmit a signal, wherein the metal wire includes:
a plurality of input metal wires configured to receive a plurality of input signals; and
a plurality of output metal wires, each configured to output respective input signal of the plurality of input signals,
wherein the multi-mode waveguide is configured to:
directly receive the plurality of input signals from the plurality of input metal wires; and
directly transmit the plurality of input signals to the plurality of output metal wires,
wherein a first direction of signal propagation in the multi-mode waveguide is parallel to a second direction of signal propagation in the metal wire.

7. A transmission method, comprising:
inputting a multiplexed input signal from an input metal wire directly to a multi-mode waveguide, wherein the multiplexed input signal is obtained by multiplexing a plurality of signals of a plurality of frequency bands; and
outputting each of the plurality of signals of the plurality of frequency bands from the multi-mode waveguide directly to a respective output metal wire of a plurality of output metal wires,
wherein a first direction of signal propagation in the multi-mode waveguide is parallel to a second direction of signal propagation in the input metal wire.

8. A transmission line, comprising:
a multi-mode waveguide; and
a metal wire configured to transmit a signal, wherein the metal wire includes:
a plurality of input metal wires to each of which a plurality of input signals of a plurality of frequency bands are inputted, and
one output metal wire configured to output a multiplexed output signal which includes the plurality of input signals of the plurality of frequency bands,
wherein the multi-mode waveguide is configured to:
receive the plurality of input signals from the plurality of input metal wires directly; and
transmit the multiplexed output signal to the one output metal wire directly.

9. A transmission method, comprising:
multiplexing a plurality of input signals of a plurality of frequency bands to obtain a multiplexed input signal;
inputting the multiplexed input signal from a metal wire to a multi-mode waveguide via a first matching structure to match impedance between the metal wire and the multi-mode waveguide; and
outputting, a plurality of impedance matched signals that correspond to respective ones of the plurality of input signals of the plurality of frequency bands, from the multi-mode waveguide to a plurality of output metal wires via a plurality of second matching structures,
wherein a first direction of signal propagation in the multi-mode waveguide is parallel to a second direction of signal propagation in the metal wire.

10. A transmission line, comprising:
a multi-mode waveguide; and
a metal wire configured to transmit a signal, wherein the metal wire includes:
one input metal wire to which a multiplexed input signal is inputted, wherein the multiplexed input signal includes a plurality of signals of a plurality of frequency bands; and
a plurality of output metal wires, wherein each of the plurality of output metal wires are configured to output a respective signal of the plurality of signals of the plurality of frequency bands,
wherein the multi-mode waveguide and the metal wire are connected directly to each other.

11. The transmission line according to claim 10, wherein each of the plurality of signals of the multiplexed input electrical signal is a millimeter wave band signal.

12. The transmission line according to claim 10, wherein the multi-mode waveguide and the metal wire are aligned on a plane.

13. The transmission line according to claim 10, further comprising a metal in contact with the multi-mode waveguide.

\* \* \* \* \*